United States Patent [19]

Prakash et al.

[11] Patent Number: 5,648,744
[45] Date of Patent: Jul. 15, 1997

[54] SYSTEM AND METHOD FOR VOLTAGE CONTROLLED OSCILLATOR AUTOMATIC BAND SELECTION

[75] Inventors: Jaideep Prakash, Dallas; Robert Rudolf Rotzoll, Allen, both of Tex.

[73] Assignee: Microtune, Inc., Plano, Tex.

[21] Appl. No.: 579,069

[22] Filed: Dec. 22, 1995

[51] Int. Cl.$^6$ ............................... H03L 7/099; H03L 7/10
[52] U.S. Cl. ...................... 331/11; 331/14; 331/16; 331/17; 331/25; 331/36 C; 331/177 V; 331/179
[58] Field of Search .................. 331/10, 11, 14, 331/16, 17, 25, 34, 36 C, 179, 177 V

[56] References Cited

U.S. PATENT DOCUMENTS

| | | | |
|---|---|---|---|
| 3,519,954 | 7/1970 | Parkyn | 331/177 |
| 3,538,450 | 11/1970 | Andrea et al. | 331/177 V |
| 3,886,485 | 5/1975 | Takahashi | 331/111 |
| 4,654,604 | 3/1987 | Smith et al. | 331/1 A |
| 4,748,425 | 5/1988 | Heck | 331/23 |
| 4,749,961 | 6/1988 | Kato et al. | 331/14 |
| 5,036,295 | 7/1991 | Kamitani | 331/10 |
| 5,053,723 | 10/1991 | Schemmel | 331/179 |
| 5,349,311 | 9/1994 | Mentzer | 331/57 |
| 5,357,222 | 10/1994 | Hietala | 332/124 |
| 5,389,898 | 2/1995 | Taketoshi et al. | 331/2 |
| 5,416,443 | 5/1995 | Cranford, Jr. et al. | 331/2 |

*Primary Examiner*—Siegfried H. Grimm
*Attorney, Agent, or Firm*—Fulbright & Jaworski L.L.P.

[57] ABSTRACT

A system and method for establishing the frequency of a voltage controlled oscillator ("VCO") within narrowly defined frequency bands. The resonant circuit of the VCO uses selectable elements, such as varactor diodes, to establish the operating frequency band. The control voltage of the VCO is varied within a voltage range to adjust the VCO output frequency. A phase detector compares the VCO output to a reference signal. If the phase detector determines that there is an imbalance between the VCO output and the reference signal, then it produces a signal which indicates whether the VCO frequency should be increased or decreased to match the reference signal frequency. If the control voltage is outside of the voltage range, then the system allows the operating frequency band to be changed by varying the number of selectable elements in response to the phase detector signal.

6 Claims, 2 Drawing Sheets

SYSTEM AND METHOD FOR VOLTAGE CONTROLLED OSCILLATOR AUTOMATIC BAND SELECTION

RELATED APPLICATION

This application is related to Ser. No. 08/577,174, SYSTEM AND METHOD FOR VOLTAGE CONTROLLED OSCILLATOR BAND SWITCHING TECHNIQUE, filed concurrently with this application and hereby incorporated by reference herein. These applications are commonly assigned.

TECHNICAL FIELD OF THE INVENTION

This invention relates to a voltage controlled oscillator (VCO) and more particularly to a system and method for automatic band selection.

BACKGROUND OF THE INVENTION

Phase-Locked Loops are used in a variety of applications such as clock recovery, frequency and phase modulation, and frequency synthesizers. Voltage controlled oscillators (VCO) are central design elements of PLL's whereby the VCO produces an output frequency proportional to its input voltage. A typical drawback of a VCO is its non-linear response in output frequency to the applied input voltage. This leads to the need for a VCO having a large gain if a wide output frequency range is required. The large VCO gain also has the effect of producing a large variation in the output frequency in response to any noise in the applied input voltage, also known as phase noise. This phase noise at the VCO output is undesirable as this limits the accuracy of the output signal.

Monolithic techniques for implementing band switching utilizing varactor diodes are taught in the above-mentioned, concurrently filed patent application. Band switching techniques allow for a reduced VCO gain for a defined operating band, leading to a reduction in the VCO output phase noise.

In a band switched system, one implementation of the varactor diode band switching technique calls for five input selection sets. In response to these binary inputs, varactor diodes are digitally switched into or out of the VCO active circuitry.

A need exists in the art for a circuit for switching diodes in and out of the circuit at the proper time to reduce phase noise.

A further need exists in the art for a circuit for confining the switching of the diodes to within a fixed operating range.

SUMMARY OF THE INVENTION

A method and system for band selection of varactor diodes within a VCO has been described. The circuit allows the VCO to operate in a well-defined operating region, optimized to reduce the non-linear response of the VCO. This technique leads to a significant reduction in the phase noise at the VCO output. This invention describes a technique for selection of the binary inputs b0-bn for a N bit selection scheme based upon whether the input signal to the circuit is leading or lagging the phase of the VCO. In this manner, the VCO itself helps define the diode level required.

It is thus one technical advantage of the invention to provide a system and method which establishes an overall range of operation and then within this range determines when to switch the various diodes into the circuit to maintain linear operation.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is how made to the following descriptions taken in conjunction with the accompanying drawings, in which.

DESCRIPTION OF THE PREFERRED EMBODIMENTS

Figure 1:
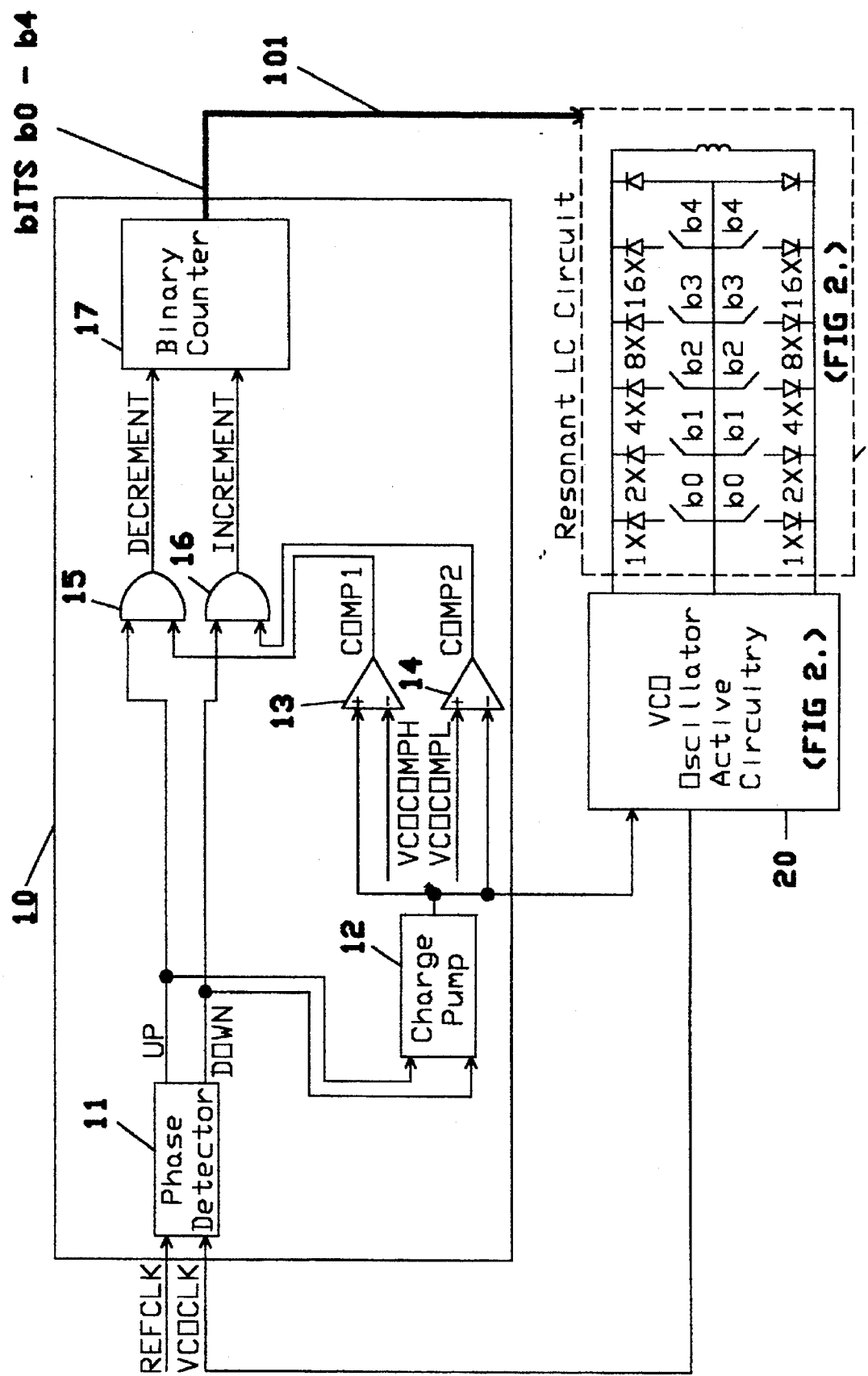
FIG. 1 shows one embodiment of the invention used to generate binary selection bits.

FIG. 1 shows the circuitry used to generate the binary selection bits, again illustrated by way of example for a five bit switching scheme. Here charge pump 12 is used to generate the voltage input to the VCO. The output of the charge pump is also compared via comparators 13 and 14 to the voltage levels VCOCOMPH, and VCOCOMPL. Voltages VCOCOMPH and VCOCOMPL are defined as the upper and lower end of the desired charge pump operating range.

Comparator 13 and 14 outputs COMP1 and COMP2 are then logically ANDED via circuits 15 and 16 with phase detector 11 output signal UP and DOWN. The UP signal is active during the period the reference signal, REFCLK, is leading VCO 20 output VCOCLK, indicating that the VCO frequency should be increased. The DOWN signal is active during the period the reference REFCLK is lagging the signal VCOCLK, indicating that the VCO frequency should be decreased. The logical AND of the UP and DOWN signals with the charge pump comparator signals is used to increment or decrement binary counter 17 generating output bits b0–b4 on bus 101.

For example, when charge pump 12 voltage exceeds the threshold defined by VCOCOMPH, comparator 13 switches active at its output COMP1. For a subsequent active UP signal, the output of logic gate 15 switches active, indicating that the VCO band currently defined needs to be changed to allow the VCO to operate at a higher frequency. This is accomplished by decrementing counter 17 so that the binary count defined by bits b0–b4 is decremented. Decrementing is controlled by the output of gate 15. This would switch off a varactor diode in the VCO active circuitry (FIG. 2) by causing one of the switches b0–b4 to open.

The PLL would again attempt to lock to the signal REFCLK within the band defined by the currently active bits b0–b4. This process continues with various switches b0–b4 being opened until the appropriate band has been selected.

To decrement the frequency, a similar process occurs with the combination of the output COMP2 of gate 14 and the DOWN signal causing counter 17 to increment. This leads to additional varactor diodes being added to the VCO active circuitry (FIG. 2), causing VCO 20 to operate at a lower frequency band. Thus, a control system is implemented to select the appropriate band defined by the value of varactor diode in the VCO active circuitry so that the VCO is able to lock to the input reference clock signal.

Figure 2:
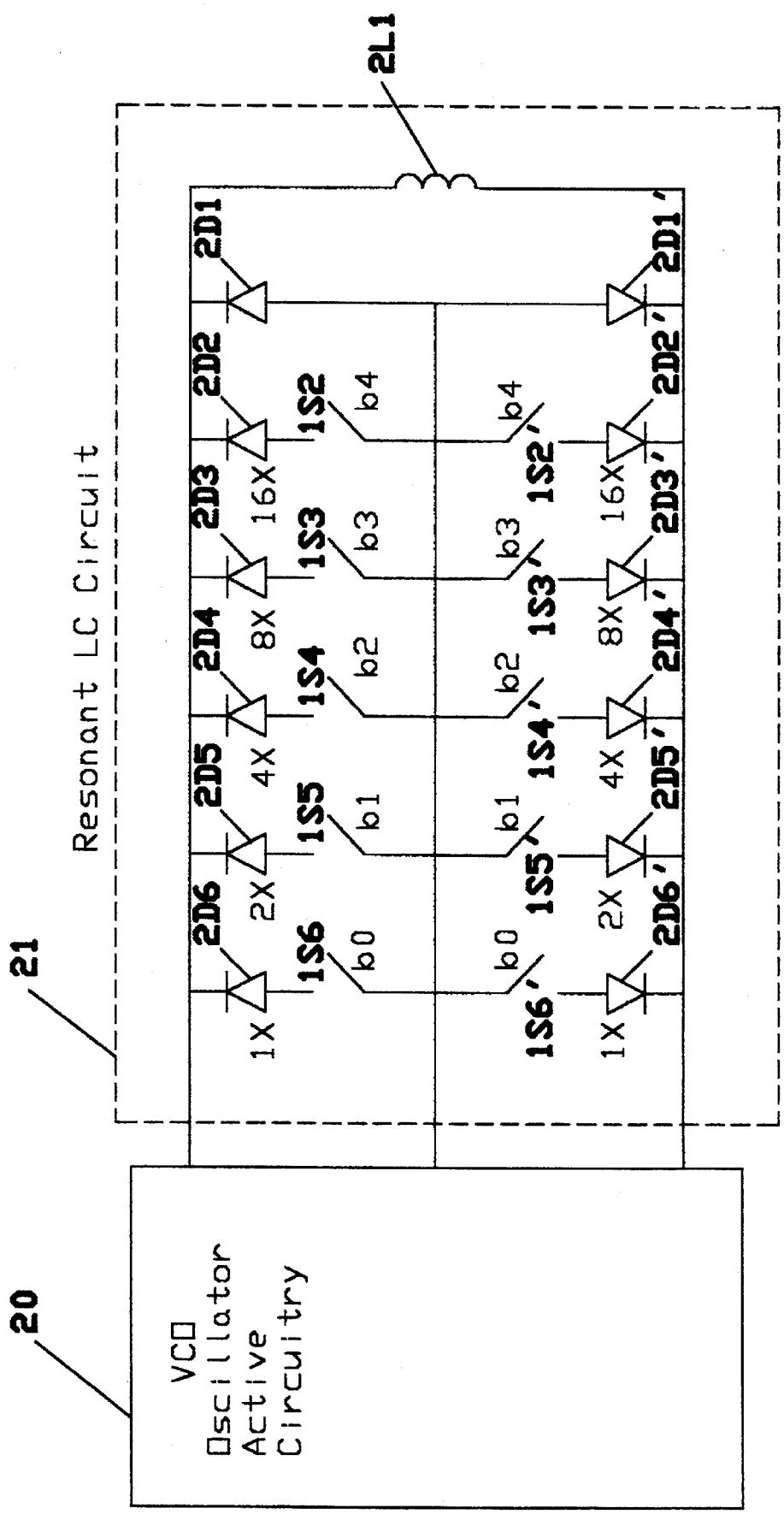
FIG. 2 shows a circuit using the switched diode technique.

The operation of VCO of FIG. 2 is detailed in the above-mentioned patent application.

Although the present invention and its advantages have been described in detail, it should be understood that various changes, substitutions and alterations can be made herein without departing from the spirit and scope of the invention as defined by the appended claims.

We claim:

1. A system for establishing the frequency of a voltage controlled oscillator operating within one of a plurality of narrowly defined frequency bands, said system operable to control the selection of the frequency band based upon the frequency of a reference signal, said system comprising:

a resonant circuit for establishing a stable output frequency of the voltage controlled oscillator, said resonant circuit having a plurality of selectable elements which operate to establish the set point for the stable output frequency;

selection control circuitry for selecting said elements of said resonant circuit, said selection circuitry including:

means for monitoring the phase between the reference signal and an output signal of the voltage controlled oscillator and for providing an imbalance signal when an imbalance is determined;

means responsive to the imbalance signal for determining whether a selectable element increase or a selectable element decrease is necessary to change said frequency band in order to correct said imbalance, and for providing an element increase signal or an element decrease signal; and means, including a binary counter, and controlled by said element increase signal or said element decrease signal, for changing an existing setting of the currently enabled selectable elements.

2. The invention set forth in claim 1, further including:

means for establishing a voltage range for a control voltage of said voltage controlled oscillator; and means controlled by said range establishing means for inhibiting said selectable element changing means when said control voltage is within said voltage range.

3. The invention set forth in claim 2, wherein said establishing means is variable.

4. The invention set forth in claim 1, wherein said plurality of selectable elements are varactor diodes switched in parallel with respect to each other.

5. A method for establishing the frequency of a voltage controlled oscillator operating within one of a plurality of narrowly defined frequency bands, said method operable to control the selection of the frequency band based upon the frequency of a reference signal, said method comprising the steps of:

establishing a stable output frequency of the voltage controlled oscillator by the use of a resonant circuit having a plurality of selectable elements which operate to establish the set point for the stable output frequency;

selecting one or more of said elements of said resonant circuit, said selecting step including the steps of:

monitoring the phase between the reference signal and an output signal of the voltage controlled oscillator and providing an imbalance signal when an imbalance is determined;

determining by said imbalance signal whether a selectable element increase or a selectable element decrease is necessary to change said output frequency in order to correct the imbalance, and providing an element increase signal or an element decrease signal; and changing an existing setting of the currently enabled selectable elements in response to said element increase signal or element decrease signal.

6. The method set forth in claim 5, further including:

establishing a voltage range for a control voltage of said voltage controlled oscillator; and inhibiting said step of changing an existing setting when said control voltage is within said voltage range.

* * * * *